(12) United States Patent
Lin

(10) Patent No.: US 8,030,676 B2
(45) Date of Patent: Oct. 4, 2011

(54) SUBSTRATE STRUCTRUE FOR LIGHT-EMITTING DIODE

(76) Inventor: Yuan Lin, Taipei (TW)

( * ) Notice: Subject to any disclaimer, the term of this patent is extended or adjusted under 35 U.S.C. 154(b) by 0 days.

(21) Appl. No.: 12/078,462

(22) Filed: Mar. 31, 2008

(65) Prior Publication Data
US 2011/0133239 A1    Jun. 9, 2011

(51) Int. Cl.
H01L 33/00 (2010.01)
(52) U.S. Cl. .................. 257/99; 257/E21.499
(58) Field of Classification Search .......... 257/88, 257/99, 100, E21.499; 174/254; 349/58, 349/68; 362/249.02
See application file for complete search history.

(56) References Cited

U.S. PATENT DOCUMENTS

| 6,830,496 B2 * | 12/2004 | Lin et al. | 445/49 |
| 7,460,195 B2 * | 12/2008 | Mai | 349/61 |
| 7,545,649 B2 * | 6/2009 | Tan | 361/749 |

* cited by examiner

Primary Examiner — David Vu
(74) Attorney, Agent, or Firm — Apex Juris, PLLC; Tracy M. Heims

(57) ABSTRACT

Disclosed is a substrate structure for light-emitting diode (LED), including an upper layer substrate, a flexible printed circuit, a lower layer substrate, and an isolation substance. The upper layer substrate has forming a conductor pattern to provide a bonding zone and a plurality of electrode zones. The flexible printed circuit is bonded under the upper layer substrate. The lower layer substrate is bonded under the flexible printed circuit and has forming conductor lines. The isolation substance is coated on the top surface of the upper layer substrate and the bottom surface of the lower layer substrate. As such, a substrate structure comprised of upper and lower layers made of the upper-layer and lower-layer substrates interposing a core made of the flexible printed circuit is formed.

12 Claims, 6 Drawing Sheets

SUBSTRATE STRUCTRUE FOR LIGHT-EMITTING DIODE

FIELD OF THE INVENTION

The present invention relates to a substrate structure for light-emitting diode (LED), and in particular to a substrate structure featuring a combination of an upper layer substrate, a flexile printed circuit, a lower layer substrate, and an isolation substance, which is formed by laminating the flexible printed circuit between the upper layer substrate and the lower layer substrate so that no surface mount technology, neither adhesive application and solder application and solder oven process, is needed, thereby eliminating the potential flaw of failure soldering between the substrate and the flexible printed circuit, enhancing the passing rate of the manufactured products and reducing the costs for being applicable to the substrate for light-emitting chips.

BACKGROUND OF THE INVENTION

Light-emitting diodes (LEDs) are of the advantages of low power consumption and long lifespan and are thus commonly used in electronic products. With the progress of science and technology, the electronic devices are now in a trend of compactness and lightweight. However, the conventional LEDs, no matter how small the size of a carrier thereof is, are of a bulky size after a light-transmitting layer is wrapped around the constituent components thereof. This is against the current trend.

To comply with the trend of compactness and light weight, surface mount technology (SMT) is now employed to mount a substrate to which a light-emitting chip is bonded to a flexible printed circuit (FPC). This is shown in FIG. 6 of the attached drawings, wherein a flexible printed circuit A is provide with an insulation substrate B thereon. The insulation substrate B can be for example a rigid printed circuit board (PCB). The printed circuit board is provided on a top surface thereof with a conductor pattern C, which forms a bonding zone C1, a positive electrode zone C2, and negative electrode zones C3. The conductive pattern C is coated with isolation resin D except where the bonding zone C1, the positive electrode zone C2, and the negative electrode zones C3 are located. The bonding zone C1 functions to provide a location for flip-chip bonding of a light-emitting chip. To use, the light-emitting chip is bonded to the bonding zone C1 on the top surface of the insulation substrate B and is electrically connected to the conductor pattern C by connection wires. Thereafter, the light-emitting chip is covered with resin E to complete the packaging process. The conventional structure described above requires adoption of surface mount technology, which needs adhesive application and reflow oven processes to carry out soldering for bonding and mounting the insulation substrate B to the flexible printed circuit. This is susceptible to potential risks of failure soldering between the insulation substrate B and the flexible printed circuit A, leading to increased flaw rate of products and also increasing manufacturing costs. When the flexible printed circuit A and the insulation substrate B are fixed together by soldering, the insulation substrate B occupies a substantial amount of the surface area, leading to increase of surface area of a unit volume, and for applications in a bent or flexed condition, the soldered portions between the flexible printed circuit A and the insulation substrate B become weak points in view of structural strength, leading to undesired separation of the flexible printed circuit A from the insulation substrate B and consequently poor electrical engagement therebetween. Further, the conventional structure is commonly used in an application for a light-emitting strip, wherein up-and-down bending, flexing and stretching occur very often, and the soldered structure of the insulation substrate B soldered to the flexible printed circuit is structurally poor in resisting flexing and stretching.

Thus, the present invention is aimed to overcome the drawbacks of the conventional devices discussed above.

SUMMARY OF THE INVENTION

An objective of the present invention is to provide a substrate structure for light-emitting diode (LED) featuring a combination of an upper layer substrate, a flexile printed circuit, a lower layer substrate, and an isolation substance, which requires no surface mount technology neither adhesive application and solder application and solder oven process are needed for soldering a substrate and a flexible printed circuit together, thereby eliminating the potential flaw of failure soldering between the substrate and the flexible printed circuit, enhancing the passing rate of the manufactured products and reducing the costs for enhancing practicability and convenience.

Another objective of the present invention is to provide a substrate structure for LED, featuring a combination of an upper layer substrate, a flexile printed circuit, a lower layer substrate, and an isolation substance, wherein laminating the flexible printed board between the upper layer substrate and the lower layer substrate effectively eliminates the weak points occurring at the soldered portions between the flexible printed board and the substrate to allow for flexed arrangement of the device and breaking through the constraints imposed by a limited installation space, making more flexible use and application, thereby enhancing practicability and convenience.

Another objective of the present invention is to provide a substrate structure for LED, featuring a combination of an upper layer substrate, a flexile printed circuit, a lower layer substrate, and an isolation substance, wherein the laminated structure effectively makes the circuit board compact and, when applied to a light-emitting chip, can substantially reduce the overall size of the light-emitting diode (LED) to be suitable for light-emitting strips of different lengths and miniaturized electronic devices to thereby enhance the practicability and convenience.

A further objective of the present invention is to provide a substrate structure for LED, featuring a combination of an upper layer substrate, a flexile printed circuit, a lower layer substrate, and an isolation substance, wherein interposing the flexible printed board between the upper and lower substrates provides enhanced resistance against bending, flexing, and stretching that might occur in general application of the product, so as to enhance the overall practicability and convenience.

To realize the above objectives, in accordance with the present invention, a substrate structure for light-emitting diode (LED) is provided, comprising an upper layer substrate, a flexible printed circuit, a lower layer substrate, and an isolation substance. The upper layer substrate has forming a conductor pattern to provide a bonding zone and a plurality of electrode zones. The flexible printed circuit is bonded under the upper layer substrate. The lower layer substrate is bonded under the flexible printed circuit and has forming conductor lines. The isolation substance is coated on the top surface of the upper layer substrate and the bottom surface of the lower layer substrate. As such, a substrate structure comprised of upper and lower layers made of the upper-layer and lower-layer substrates interposing a core made of the flexible printed circuit is formed, which enhances practicability and convenience.

BRIEF DESCRIPTION OF THE DRAWINGS

The present invention will be apparent to those skilled in the art by reading the following description of a preferred embodiment thereof with reference to the drawings, in which.

DETAILED DESCRIPTION OF THE PREFERRED EMBODIMENT

Figure 1:
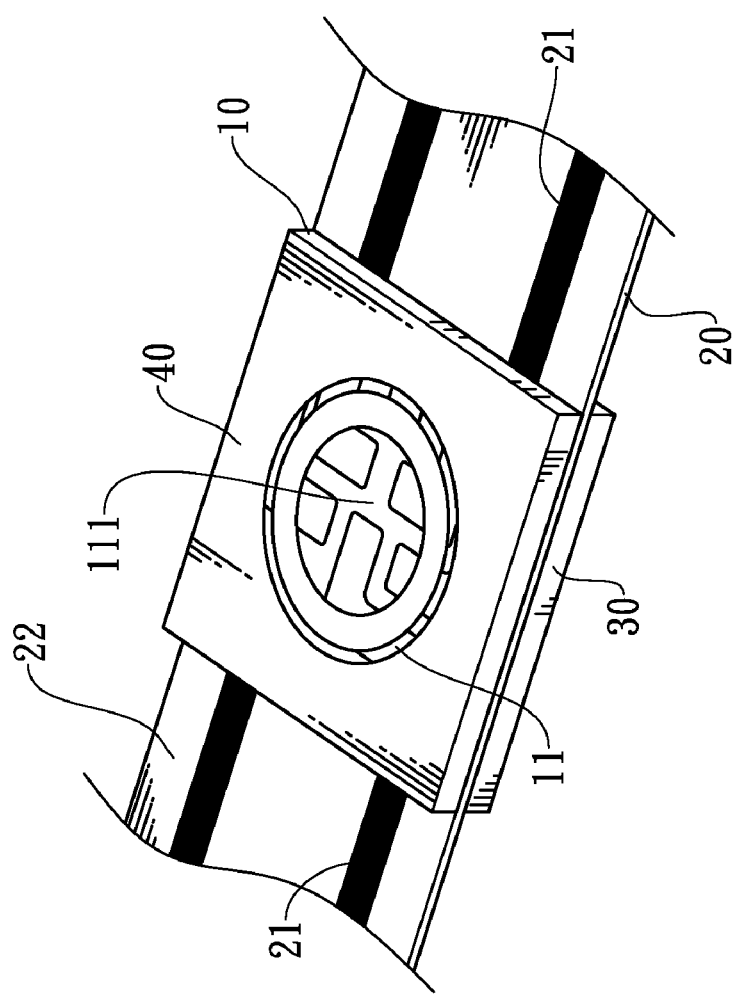
FIG. 1 is a perspective view of an embodiment of the present invention.
Figure 2:
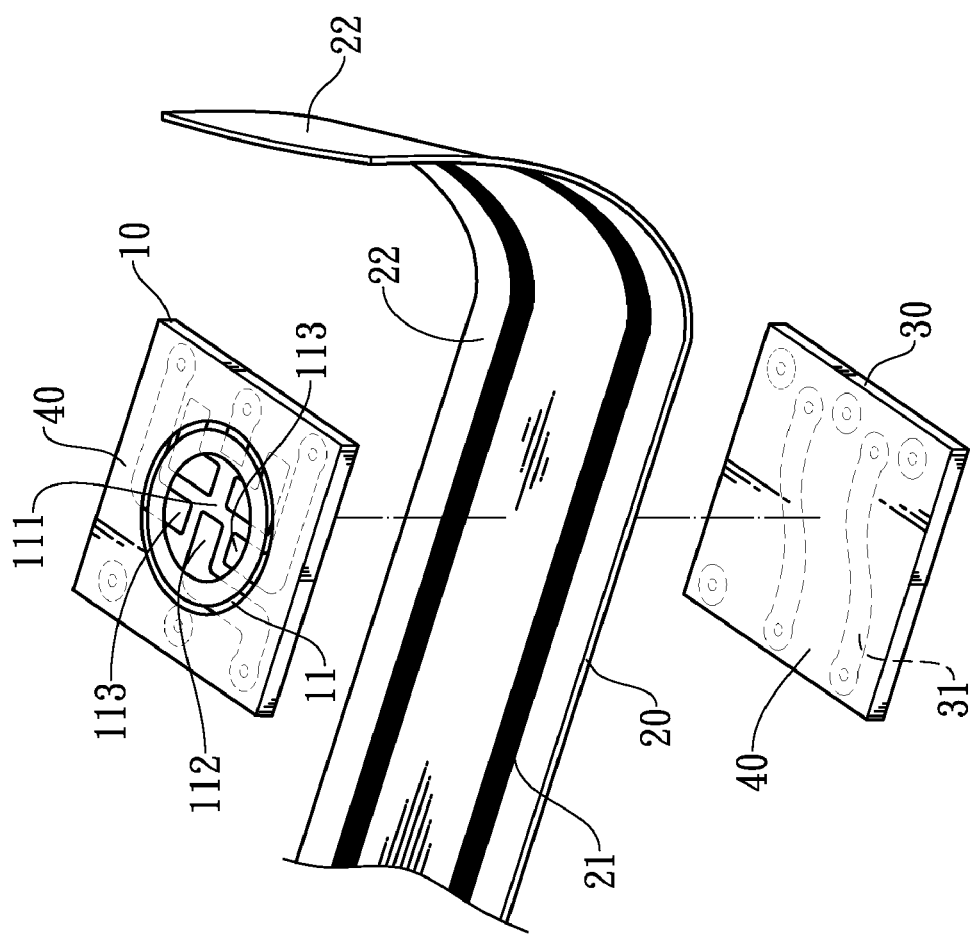
FIG. 2 is an exploded view of the embodiment of the present invention.
Figure 3:
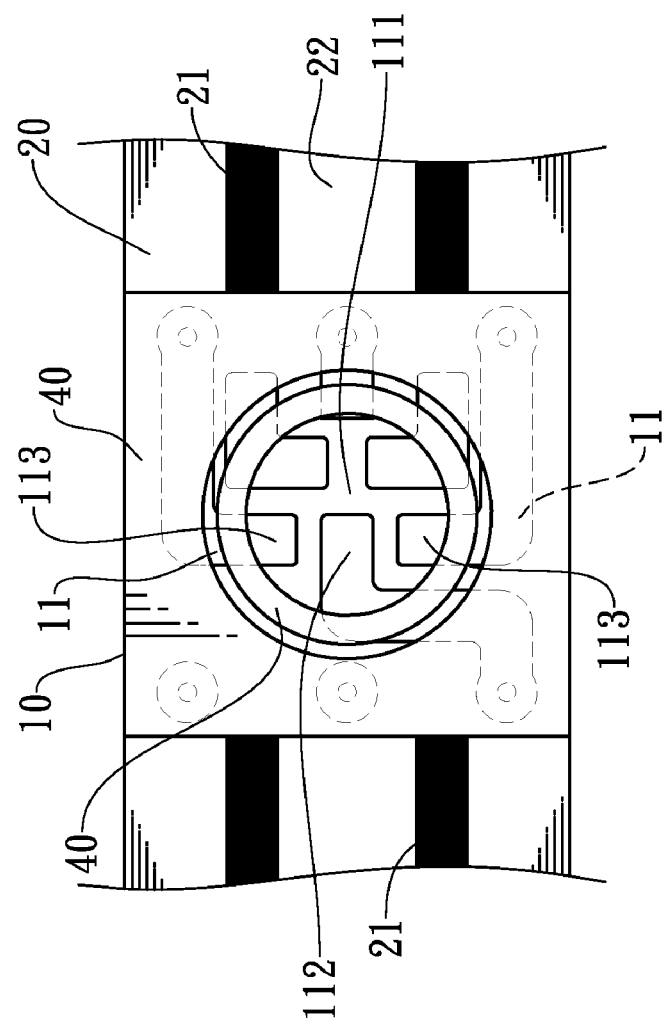
FIG. 3 is a top plan view of the embodiment of the present invention.
Figure 4:
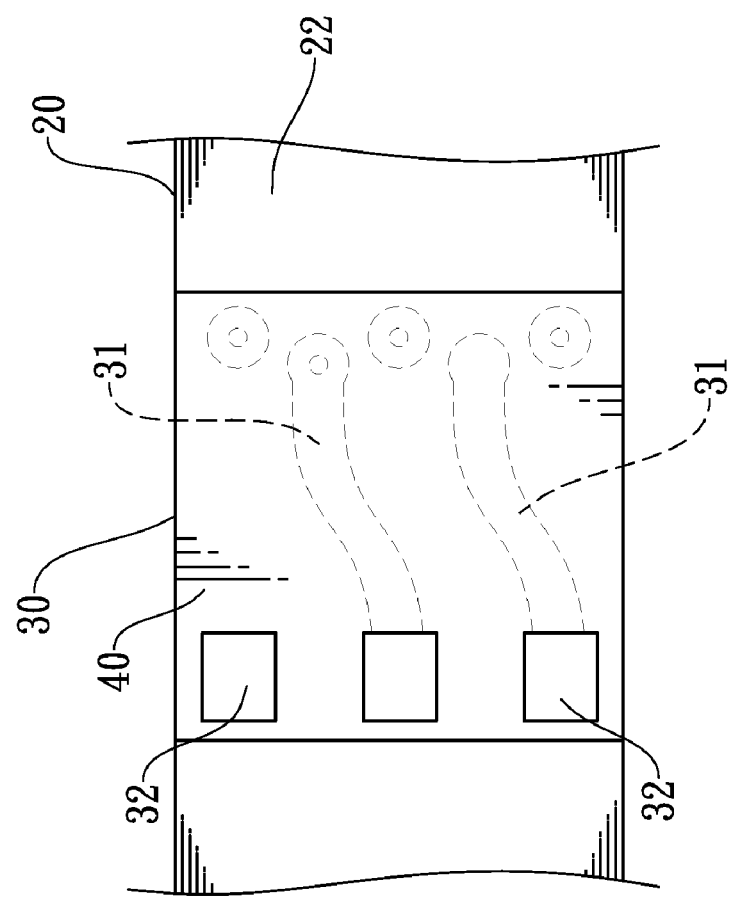
FIG. 4 is a bottom view of the embodiment of the present invention.

With reference to the drawings and in particular to FIGS. 1-4, which show a substrate structure for a light-emitting diode (LED) constructed in accordance with the present invention, the substrate structure of the present invention comprises an upper layer substrate 10, which comprises an insulation substrate, which can be for example a printed circuit board (PCB), a glass fiber board (such as FR-4), a temperature-resistant glass fiber board (such as FR5), a ceramic substrate, a metal-core PCB (MCPCB), a direct copper bonded (DCB) substrate, a metal composite board, a copper-coated aluminum board, or an aluminum board. The upper layer substrate 10 has a top face on which a conductor pattern 11 is formed. The conductor layer 11 is formed by coating a conductor layer on the top surface of the upper-layer substrate 10, followed by etching to form a desired layout of conductor lines. The conductor layer 11 is formed to comprise a bonding zone 111 and a plurality of electrode zones. In the embodiment illustrated, the electrode zones include zones for one positive electrode 112 and two negative electrodes 113. The upper layer substrate 10 functions for mounting of a SMD (Surface-Mount Device) LED thereon. The bonding zone 111 of the upper layer substrate 10 can be further bonded with a light-emitting chip. The bonding between the upper layer substrate 10 and the light-emitting chip can be for example flip chip bonding so that the light-emitting chip is directly bonded to the bonding zone 111 and is electrically connected to the electrode zones of the positive electrode 112 and the two negative electrodes 113 by means of the conduction layout of the conductor patter 11. Or alternatively, in practice, the bonding between the upper layer substrate 10 and the light-emitting chip can be for example wiring bonding, wherein the light-emitting chip is first soldered to the bonding zone 111 of the upper layer substrate 10 and then wire bonding is employed to electrically connect the light-emitting chip to the positive and negative electrode zones 112, 113 to induce electrical conduction therebetween. The light-emitting chip can be for example an SMD LED.

The substrate structure of the present invention further comprises a flexible board 20, which can be a flexible printed circuit (FPC). The flexible board 20 is bonded under the upper layer substrate 10. The flexible board 20 can be made of a flexible material, such as for example polyimide. The flexible board 20 has a surface that is bonded to the upper layer substrate 10 and the surface is provided with metal wiring layer 21 and metal coating layer 22. The metal wiring layer 21 forms a layout of conductor wiring. The metal wiring layer 21 can be made of a material selected from a group consisting of aluminum, silver, copper, nickel, iron, cobalt, cadmium, and platinum. The metal coating layer 22 is distributed in area excluding the metal wiring layer 21. The flexible board 20 has an opposite surface on which a metal coating layer 22 is formed. The metal coating layer 22 is made of material selected from a group consisting of gold (Au), nickel (Ni), and chromium (Cr).

The substrate structure of the present invention further comprises a lower layer substrate 30, which is bonded under the flexible board 20. The lower layer substrate 30 on which conductor lines 31 are provided. The lower layer substrate 30 comprises an insulation substrate, which can be for example a printed circuit board (PCB), a glass fiber board (such as FR-4), a temperature-resistant glass fiber board (such as FR5), a ceramic substrate, a metal-core PCB (MCPCB), a direct copper bonded (DCB) substrate, a metal composite board, a copper-coated aluminum board, or an aluminum board. Or alternatively, the lower layer substrate 30 can be made of other materials featuring low thermal resistance and high thermal conductivity or materials featuring low thermal resistance and high electrical resistance. In addition, the lower layer substrate 30 can be further combined with an aluminum made heat dissipation device or heat sink (not shown) to ensure high performance of heat dissipation.

Figure 5:
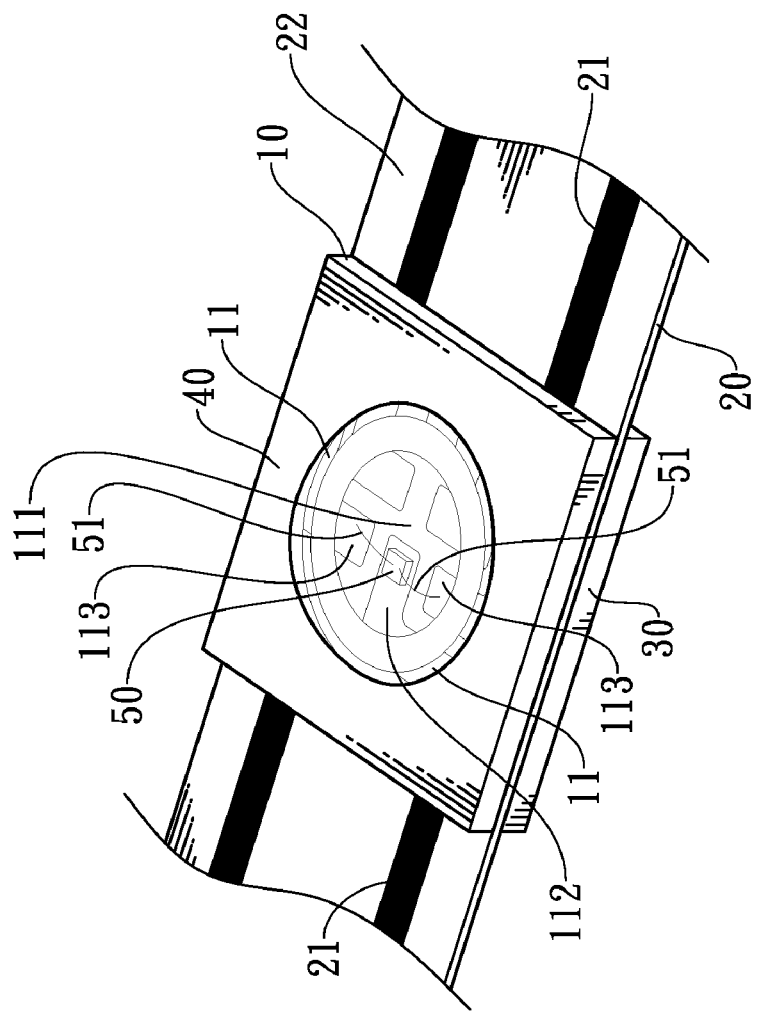
FIG. 5 is a perspective view showing the embodiment of the present invention with a light-emitting diode (LED) mounted thereto.
Figure 6:
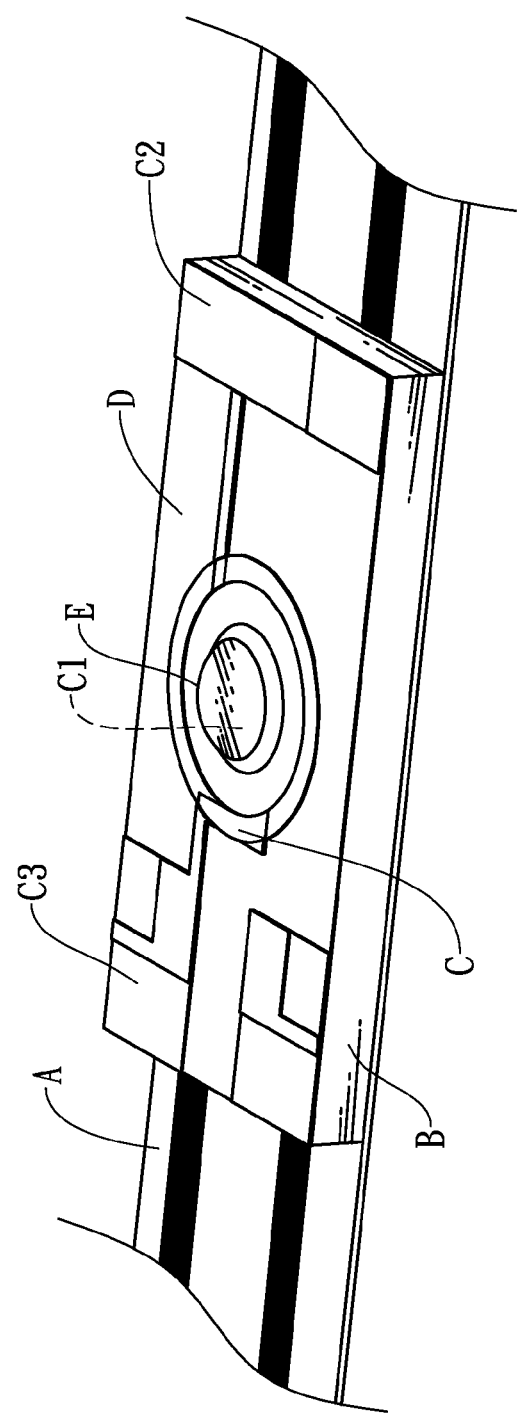
FIG. 6 shows a perspective view of a conventional structure.

An isolation substance or resin 40 is coated on the top surface of the upper layer substrate 10 and the bottom surface of the lower layer substrate 30. The isolation substance 40 can be for example polyurethane (PU) or other insulation substance or resin. When the upper layer substrate 10 is coated with the isolation substance 40, the bonding zone 111 does not needed to be coated with the isolation substance 40 in order to bond with at least one light-emitting chip 50 (as shown in FIG. 5). The electrode zones of the positive electrode 112 and the negative electrodes 113 located inside the bonding zone 111 are not coated with the isolation substance 40 in order to electrically connect the at least one light-emitting chip 50. The bottom surface of the lower layer substrate 30 can be completely coated with the isolation substance 40 to thereby complete cover the conductor lines 31. Or alternatively, a plurality of contacts 32 (see FIG. 4) can be formed and the contacts are not coated with the isolation substance.

Referring to FIGS. 1-5, the substrate structure of the present invention is formed as described above and features a combination of an upper layer substrate 10, a flexible board 20, a lower layer substrate 30 and isolation substance 40, wherein the upper layer substrate 10 and the lower layer substrate 20 interpose the flexible board 20 to thereby form a structure having upper and lower layers formed by substrates (the upper layer substrate 10 and the lower layer substrate 30) and a core formed by the flexible board 20. The top surface of the upper layer substrate 10 is provided with conductor pattern 11, by which a bonding zone 111 and electrode zones for positive and negative electrodes (which include individual zones for one positive electrode 112 and the two negative electrodes 113) are formed, so that in practical applications, at least one light-emitting chip 50 (see FIG. 5) can be mounted to the bonding zone 111 of the upper layer substrate 10 by means of flip chip techniques and electrically connected to the electrode zones by the arrangement of the conductor patter 11, or alternatively mounting by wire bonding can be adopted to first electrically connect the at least one light-emitting chip 50 the electrode zones of the positive electrode 112 and the negative electrode 113 of the upper layer substrate 10 by conductors 51 and then bonded to the bonding zone 111 of the upper layer substrate 10. Thereafter, the isolation substance 40 is applied to coat on the top surface of the upper layer substrate, except the bonding zone 111, to protect the conductor pattern 11 and prevent the conductor pattern 11 from inadvertent short-circuiting. Further, the isolation substance 40 is also applied to the bottom surface conductor lines 31 of the lower layer substrate 30 to protect the conductor lines 31. Further, the lower layer substrate 30 can be additionally provided with at least one contact 32 and the contact 32 is avoided from the coating of the isolation substance 40 for the connection with a power source. To summarize, the present invention provides a laminated three-ply structure and thus no SMT process for adhesive application and solder application is needed to solder a substrate and a flexible circuit board together. This apparently eliminates the potential flaw of failure soldering between the substrate and the flexible circuit board to thereby enhance the passing rate of the manufactured product and reduce the costs. Laminating a flexible board 30 between the upper layer substrate 10 and the lower layer substrate 30 effectively eliminates the weak points occurring at the soldered portions between the flexible board and the substrate to thereby allow for flexed arrangement of the device and break through the constraint imposed by a limited installation space, making more flexible use and application. Further, such a laminated structure effectively makes the circuit board compact and when applied to a light-emitting chip, can substantially reduce the overall size of the light-emitting diode (LED) to be suitable for light-emitting strips of different lengths and miniaturized electronic devices. Further, interposing the flexible board (FPC) between the upper and lower substrates provides enhanced resistance against bending, flexing, and stretching that might occur in general application of the product, as compared to the conventional structure wherein the substrate is soldered to the flexible circuit board. Thus, practicability and convenience can be enhanced.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A substrate structure for light-emitting diode (LED), comprising:
   an upper layer substrate has forming a conductor pattern to provide a bonding zone and a plurality of electrode zones;
   a flexible board bonded under the upper layer substrate;
   a lower layer substrate bonded under the flexible board and has forming conductor lines; and
   an isolation substance coated on the top surface of the upper layer substrate and the bottom surface of the lower layer substrate;
   whereby a substrate structure comprising upper and lower layers made of the upper-layer and lower-layer substrates interposing a core made of the flexible board is formed.

2. The substrate structure as claimed in claim 1, wherein the upper layer substrate and the lower layer substrate comprise insulation substrates.

3. The substrate structure as claimed in claim 1, wherein the upper layer substrate and the lower layer substrate comprise board selected from a group consisting of printed circuit board (PCB), glass fiber board (FR-4), temperature-resistant glass fiber board (FR5), ceramic substrate, metal-core PCB (MCPCB), direct copper bonded (DCB) substrate, metal composite board, copper-coated aluminum board, and aluminum board.

4. The substrate structure as claimed in claim 2, wherein the upper layer substrate and the lower layer substrate comprise board selected from a group consisting of printed circuit board (PCB), glass fiber board (FR-4), temperature-resistant glass fiber board (FR5), ceramic substrate, metal-core PCB (MCPCB), direct copper bonded (DCB) substrate, metal composite board, copper-coated aluminum board, and aluminum board.

5. The substrate structure as claimed in claim 1, wherein the lower layer substrate is made of a material of low thermal resistance and high thermal conductivity.

6. The substrate structure as claimed in claim 1, wherein the lower layer substrate is combined with an aluminum-made heat dissipation device.

7. The substrate structure as claimed in claim 1, wherein the isolation substance comprises polyurethane.

8. The substrate structure as claimed in claim 1, wherein the flexible board is made of a flexible material.

9. The substrate structure as claimed in claim 1, wherein the flexible board forms metal wiring on a surface thereof bonded to the upper layer substrate, the metal wiring forming a layout of conductor wiring, the flexible board having an opposite surface on which a metal coating layer is formed.

10. The substrate structure as claimed in claim 9, wherein the metal coating layer is made of material selected from a group consisting of gold (Au), nickel (Ni), and chromium (Cr).

11. The substrate structure as claimed in claim 9, wherein the metal wiring layer is made of a material selected from a group consisting of aluminum, silver, copper, nickel, iron, cobalt, cadmium, and platinum.

12. The substrate structure as claimed in claim 1, wherein the bonding zone of the upper layer substrate is mounted with at least one light-emitting chip, which is electrical connected to the plurality of electrode zones of the upper layer substrate.

* * * * *